(12) United States Patent
Martinjak et al.

(10) Patent No.: US 12,217,596 B2
(45) Date of Patent: Feb. 4, 2025

(54) MONITOR SYSTEM FOR SURGE PROTECTION DEVICES

(71) Applicant: ERICO International Corporation, Solon, OH (US)

(72) Inventors: Greg Martinjak, Solon, OH (US); Spencer Allemang, Novelty, OH (US); Thomas Bendlak, Macedonia, OH (US)

(73) Assignee: ERICO International Corporation, Solon, OH (US)

( * ) Notice: Subject to any disclaimer, the term of this patent is extended or adjusted under 35 U.S.C. 154(b) by 287 days.

(21) Appl. No.: 17/970,196

(22) Filed: Oct. 20, 2022

(65) Prior Publication Data

US 2023/0124733 A1    Apr. 20, 2023

Related U.S. Application Data

(60) Provisional application No. 63/257,808, filed on Oct. 20, 2021.

(51) Int. Cl.
| | |
|---|---|
| *G08B 21/18* | (2006.01) |
| *G01R 1/02* | (2006.01) |
| *G01R 31/40* | (2020.01) |
| *G08C 17/02* | (2006.01) |
| *H02H 9/02* | (2006.01) |

(52) U.S. Cl.
CPC ............. *G08B 21/185* (2013.01); *G01R 1/02* (2013.01); *G01R 31/40* (2013.01); *G08C 17/02* (2013.01); *H02H 9/02* (2013.01)

(58) Field of Classification Search
CPC ........ G08B 21/185; G01R 1/02; G01R 31/40; G08C 17/02; H02H 9/02; H02H 9/042
See application file for complete search history.

(56) References Cited

U.S. PATENT DOCUMENTS

| | | | |
|---|---|---|---|
| 4,866,560 A | 9/1989 | Allina | |
| 4,901,187 A | 2/1990 | Allina | |
| 4,907,118 A * | 3/1990 | Hames | ............... H01R 13/6666 337/28 |
| 4,907,119 A | 3/1990 | Allina | |
| 4,931,895 A | 6/1990 | Allina | |
| 5,006,950 A | 4/1991 | Allina | |
| 5,130,884 A | 7/1992 | Allina | |
| 5,140,491 A | 8/1992 | Allina | |
| 5,148,345 A | 9/1992 | Allina | |
| RE35,077 E | 10/1995 | Allina | |

(Continued)

FOREIGN PATENT DOCUMENTS

| | | |
|---|---|---|
| AU | 2017202441 A1 | 11/2017 |
| CN | 101102041 A | 1/2008 |

(Continued)

*Primary Examiner* — Christopher P McAndrew
(74) *Attorney, Agent, or Firm* — Quarles & Brady LLP

(57) ABSTRACT

A monitor system for one or more surge protection devices may include a hub configured for wireless communication with one or more remote devices, or a sensor configured to detect an end-of-life state of a surge protection device (SPD). The sensor may include a transmitter configured to wirelessly transmit a sensor signal to the hub to indicate the end-of-life state of the SPD. The hub may be configured to transmit to one or more of a remote server or a mobile device a hub signal corresponding to the end-of-life state.

20 Claims, 5 Drawing Sheets

(56) References Cited

U.S. PATENT DOCUMENTS

| | | | |
|---|---|---|---|
| 5,596,468 A | 1/1997 | Allina | |
| 5,617,287 A | 4/1997 | Allina | |
| 5,748,093 A * | 5/1998 | Swanson | H02H 9/042 361/111 |
| 6,556,394 B1 | 4/2003 | Wilson | |
| 7,026,917 B2 | 4/2006 | Berkman | |
| 7,098,773 B2 | 8/2006 | Berkman | |
| 7,321,291 B2 | 1/2008 | Gidge et al. | |
| 7,324,005 B2 | 1/2008 | Stoof | |
| 7,382,232 B2 | 6/2008 | Gidge et al. | |
| 7,411,769 B2 | 8/2008 | Schimanski et al. | |
| 7,450,000 B2 | 11/2008 | Gidge et al. | |
| 7,453,368 B2 | 11/2008 | Baldwin | |
| 7,510,429 B1 * | 3/2009 | Savicki, Jr. | H02G 3/18 174/53 |
| 7,697,248 B2 | 4/2010 | Tomimbang | |
| 7,961,111 B2 | 6/2011 | Tinaphong et al. | |
| 8,310,322 B2 | 11/2012 | Tomimbang | |
| 8,659,866 B2 | 2/2014 | Douglass et al. | |
| 8,699,197 B2 | 4/2014 | Douglass et al. | |
| 8,699,198 B2 * | 4/2014 | Spalding | H01C 7/126 361/111 |
| 8,817,431 B2 | 8/2014 | Tomimbang et al. | |
| 8,879,218 B2 | 11/2014 | Tomimbang | |
| 8,957,748 B2 | 2/2015 | Tomimbang | |
| 8,995,098 B2 | 3/2015 | Tomimbang | |
| 9,099,258 B2 * | 8/2015 | Padro | H01H 1/26 |
| 9,099,860 B2 | 8/2015 | Martinez et al. | |
| 9,885,738 B2 | 2/2018 | Moosburger et al. | |
| 9,978,553 B2 | 5/2018 | Tomimbang et al. | |
| 10,004,123 B1 | 6/2018 | Yang et al. | |
| 10,274,379 B2 | 4/2019 | Khatri et al. | |
| 10,319,545 B2 | 6/2019 | Kamensek et al. | |
| 10,345,372 B2 | 7/2019 | Wilson et al. | |
| 10,380,869 B1 | 8/2019 | Matyac | |
| 10,673,225 B2 | 6/2020 | Eriksen et al. | |
| 10,685,767 B2 * | 6/2020 | Kamenšek | H02H 9/04 |
| 10,734,176 B2 | 8/2020 | Kamensek et al. | |
| 10,841,127 B1 | 11/2020 | Greer et al. | |
| 10,866,274 B2 | 12/2020 | Wilson et al. | |
| 10,892,129 B2 | 1/2021 | Wang et al. | |
| 10,910,776 B2 | 2/2021 | Eriksen et al. | |
| 11,050,241 B2 | 6/2021 | Fisher | |
| 11,052,784 B2 | 7/2021 | Mensch et al. | |
| 11,063,421 B2 | 7/2021 | Griffiths | |
| 11,070,049 B2 | 7/2021 | Mensch et al. | |
| 11,075,514 B2 | 7/2021 | Shah et al. | |
| 11,081,874 B2 | 8/2021 | Fisher | |
| 11,081,875 B2 | 8/2021 | Fisher | |
| 11,087,943 B2 | 8/2021 | Douglass et al. | |
| 11,088,533 B2 | 8/2021 | Fisher | |
| 11,095,115 B2 | 8/2021 | Fisher | |
| 11,095,116 B2 | 8/2021 | Douglass | |
| 11,095,120 B2 * | 8/2021 | Ku | H02H 3/025 |
| 11,101,639 B2 | 8/2021 | Griffiths et al. | |
| 11,108,225 B2 | 8/2021 | Fisher | |
| 11,114,840 B2 | 9/2021 | Fisher | |
| 11,121,540 B2 | 9/2021 | Mensch et al. | |
| 11,128,124 B2 | 9/2021 | Shah et al. | |
| 11,128,125 B2 | 9/2021 | Fisher | |
| 11,152,781 B2 | 10/2021 | Fisher | |
| 11,159,008 B2 | 10/2021 | Fisher | |
| 11,183,828 B1 | 11/2021 | Smith et al. | |
| 11,183,833 B2 | 11/2021 | Shah et al. | |
| 2005/0212522 A1 * | 9/2005 | Finlay, Sr. | G01R 31/14 324/509 |
| 2006/0291575 A1 | 12/2006 | Berkman et al. | |
| 2007/0076505 A1 | 4/2007 | Radtke et al. | |
| 2009/0086390 A1 * | 4/2009 | Huang | H01H 83/04 361/49 |
| 2010/0097733 A1 * | 4/2010 | E. | H02H 1/0015 361/42 |
| 2011/0115511 A1 * | 5/2011 | Finlay, Sr. | H01H 83/04 324/750.3 |
| 2011/0148423 A1 * | 6/2011 | Richards | G01R 31/14 324/424 |
| 2011/0193674 A1 * | 8/2011 | Zauner | H01T 1/14 337/142 |
| 2011/0222195 A1 * | 9/2011 | Benoit | H01R 25/00 361/45 |
| 2012/0223840 A1 | 9/2012 | Guymon et al. | |
| 2012/0239321 A1 | 9/2012 | Normoyle et al. | |
| 2014/0118102 A1 * | 5/2014 | Iwasaki | H01H 85/32 337/187 |
| 2014/0176336 A1 | 6/2014 | Li et al. | |
| 2014/0204497 A1 | 7/2014 | Martinez Sanchez et al. | |
| 2015/0130276 A1 | 5/2015 | McNeill-McCallum et al. | |
| 2015/0185259 A1 | 7/2015 | Axelsson et al. | |
| 2016/0169959 A1 | 6/2016 | Li et al. | |
| 2020/0114776 A1 | 4/2020 | Fisher | |
| 2020/0114777 A1 | 4/2020 | Fisher et al. | |
| 2020/0114778 A1 | 4/2020 | Fisher | |
| 2020/0114779 A1 | 4/2020 | Fisher et al. | |
| 2020/0114780 A1 | 4/2020 | Douglass et al. | |
| 2020/0114781 A1 | 4/2020 | Douglass | |
| 2020/0114782 A1 | 4/2020 | Douglass | |
| 2020/0114783 A1 | 4/2020 | Douglass | |
| 2020/0114784 A1 | 4/2020 | Fisher | |
| 2020/0185907 A1 | 6/2020 | Griffiths | |
| 2020/0194996 A1 * | 6/2020 | Fisher | H05K 7/2089 |
| 2020/0212959 A1 * | 7/2020 | Eriksen | H02H 1/0092 |
| 2020/0235567 A1 | 7/2020 | Griffiths et al. | |
| 2020/0274375 A1 | 8/2020 | Griffiths et al. | |
| 2020/0328586 A1 | 10/2020 | Eriksen et al. | |
| 2020/0366080 A1 | 11/2020 | Eriksen et al. | |
| 2021/0043373 A1 | 2/2021 | Ortiz et al. | |
| 2021/0055341 A1 | 2/2021 | Wilson et al. | |
| 2021/0183606 A1 | 6/2021 | Douglass et al. | |
| 2021/0218242 A1 | 7/2021 | Mensch et al. | |
| 2021/0249823 A1 | 8/2021 | Eriksen et al. | |
| 2021/0249850 A1 | 8/2021 | Eriksen et al. | |
| 2022/0006283 A1 | 1/2022 | Dukaric et al. | |
| 2022/0006284 A1 | 1/2022 | Dukaric et al. | |
| 2022/0006285 A1 | 1/2022 | Dukaric et al. | |
| 2022/0131398 A1 | 4/2022 | Herranz et al. | |
| 2022/0221016 A1 | 7/2022 | Sienkiewicz et al. | |
| 2022/0225064 A1 | 7/2022 | Greer et al. | |
| 2022/0357387 A1 | 11/2022 | Saenger et al. | |

FOREIGN PATENT DOCUMENTS

| | | |
|---|---|---|
| CN | 201417939 Y | 3/2010 |
| CN | 201623479 U | 11/2010 |
| CN | 101931223 A | 12/2010 |
| CN | 204167885 U | 2/2015 |
| CN | 206364491 U | 7/2017 |
| CN | 110380393 A | 10/2019 |
| CN | 110429002 A | 11/2019 |
| CN | 110492445 A | 11/2019 |
| EP | 3690457 A1 | 8/2020 |
| WO | 2007/128628 A1 | 11/2007 |
| WO | 2016/105551 A1 | 6/2016 |
| WO | 2018/018144 A1 | 2/2018 |
| WO | 2018/053644 A1 | 3/2018 |
| WO | 2019/197459 A2 | 10/2019 |
| WO | 2020/193466 A1 | 10/2020 |

\* cited by examiner

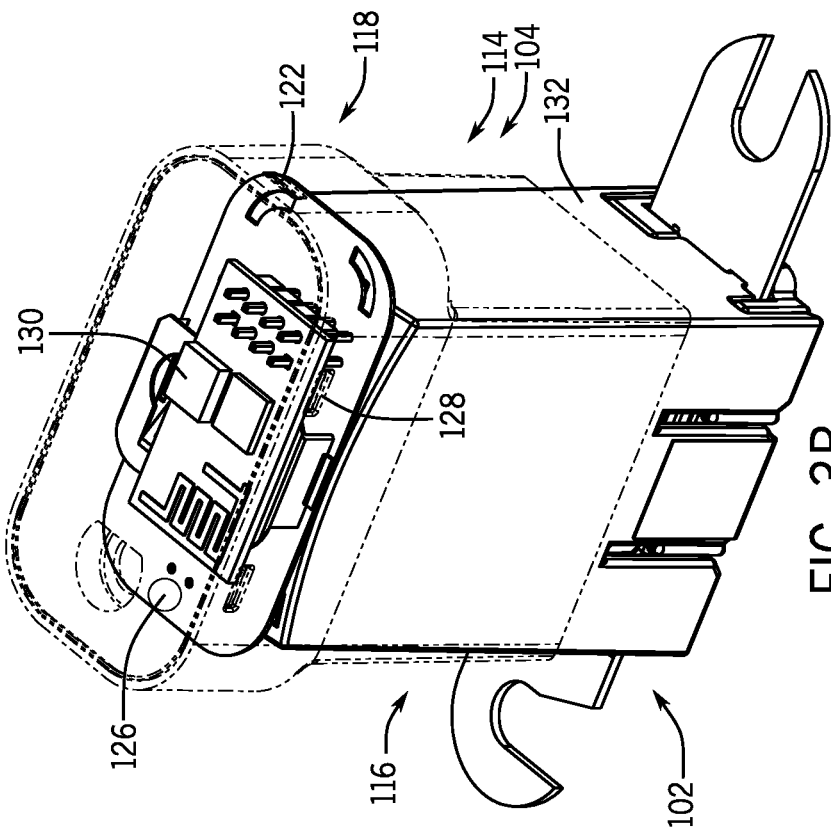
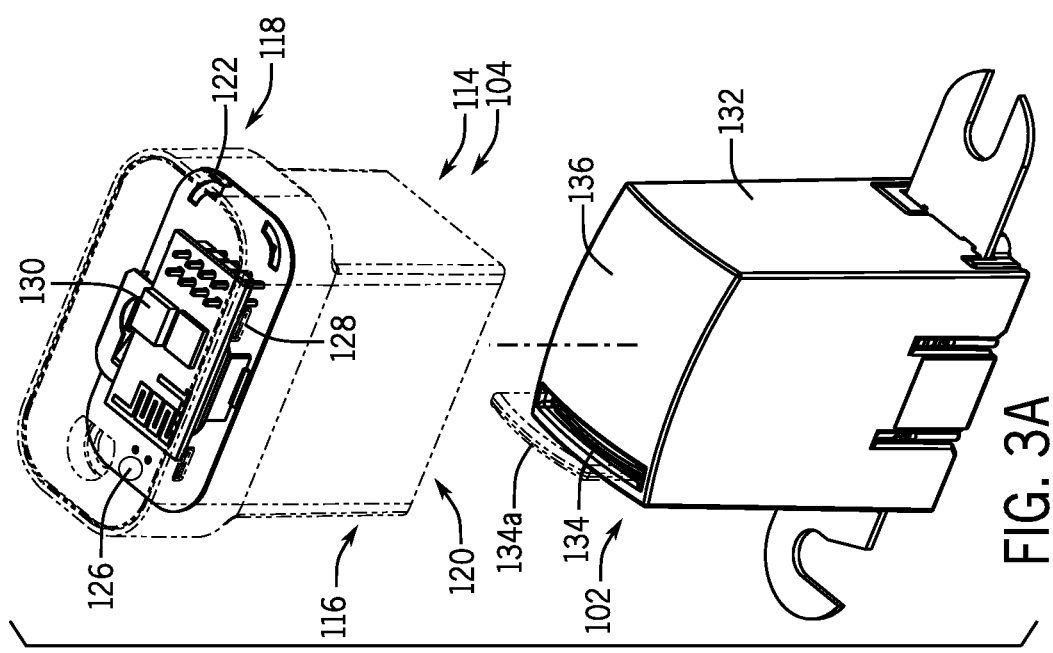

MONITOR SYSTEM FOR SURGE PROTECTION DEVICES

CROSS-REFERENCE TO RELATED APPLICATIONS

This application claims priority to U.S. provisional patent application No. 63/257,808, filed Oct. 20, 2021, the entirety of which is incorporated herein by reference.

BACKGROUND

Surge protection devices (also known as surge protective devices) can be important in a variety of contexts to protect equipment from surges of electrical current. In some setting, surge protection devices may need to be replaced or otherwise serviced after a surge event.

SUMMARY

The present invention relates generally to monitoring of surge protection devices.

Some embodiments provide a surge protection system that includes a surge protection device, and a surge protection monitor system. The surge protection device can include a flag movable between a ready state corresponding to normal operation of the surge protection device and a triggered state corresponding to an end-of-life state of the surge protection device. The surge protection monitor system can include a sensor that includes a switch and an electronic transmitter configured to wirelessly transmit signals based on a state of the switch. In an installed configuration, the sensor can be secured to the surge protection device with the switch aligned to detect a position of the flag that corresponds to the triggered state, and the transmitter can be configured to wirelessly transmit an end-of-life signal to indicate that the surge protection device is in the end-of-life state, in response to detection of the position of the flag by the switch.

Some embodiments provide a retrofit system to monitor a surge protection device. The retrofit system can include a sensor configured to be removably secured to a surge protection device. The sensor can include a housing, a detector, and a transmitter. The housing can be configured to removably engage the surge protection device to secure the sensor to the surge protection device. The detector can be configured to detect a movement of a component of the surge protection device corresponding to an end of life state of the surge protection device. The transmitter can be configured to transmit a wireless signal to a remotely located hub, in response to the detected movement, to indicate the end of life state of the surge protection device.

Some embodiments of the invention provide a method of monitoring surge protection devices. A surge protection device can be retrofit by removably engaging a housing of a sensor with a surge protection device to secure the sensor to the surge protection device, and pairing the sensor with a remotely located hub to permit wireless communication between a transmitter of the sensor and the remotely located hub. A detector of the sensor can be arranged to detect a movement of a component of the surge protection device corresponding to an end of life state of the surge protection device. The transmitter can be configured to transmit a wireless signal to the remotely located hub to indicate the end of life state of the surge protection device in response to the detector detecting the movement of the component of the surge protection device.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 3A is an exploded view of the sensor of FIG. 2B coupled to a surge protector device, according to an embodiment of the invention;

FIG. 3B is an assembled view of the sensor and surge protector device of FIG. 3A.

DETAILED DESCRIPTION

Figure 1:
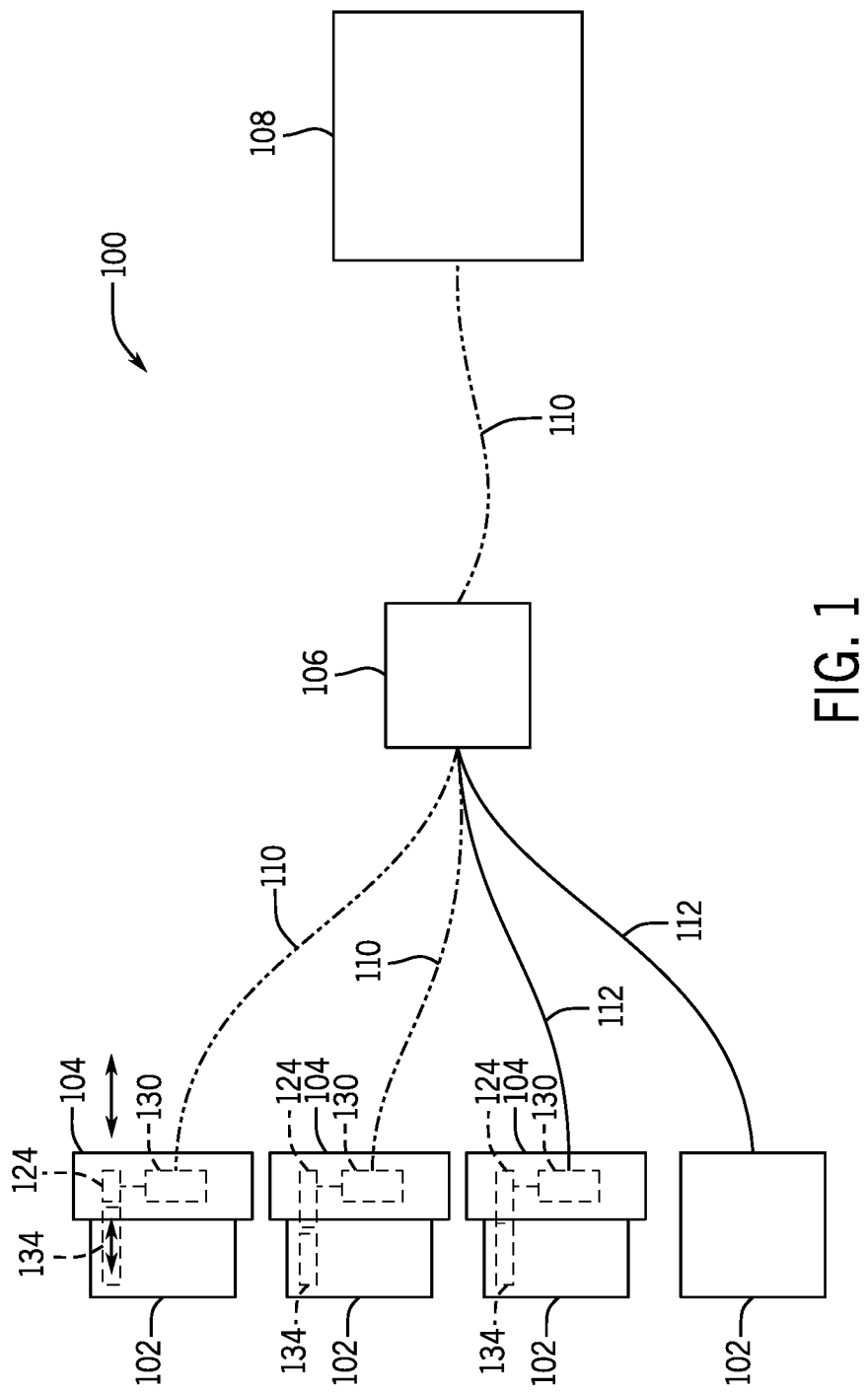
FIG. 1 is an example schematic view of a monitor system for one or more surge protection devices, according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As noted above, surge protection devices (SPDs) can be important in a variety of contexts. In some setting, it may be useful for surge protection devices to include monitor systems. For example, it may be useful to monitor the status of a number of surge protection devices in a railway bungalow, or other setting. However, due to installation and maintenance costs, and the nature of many relevant environments, high-bandwidth or wireless communication channels may not be available for transmission of monitoring data for SPDs, including to remote locations. Correspondingly, conventional monitor systems for SPDs can require operators to locally (e.g., manually, or visually) check each individual SPD to determine if an SPD may have entered an end-of-life state. Conventional systems for monitoring surge protection devices may thus require vigilant adherence to inspection schedules in order for operators to promptly identify SPDs that have reached end of life state. For example, if an operator were to only manually check SPDs once a month, then it is possible that an SPD may be installed in an end of life state for up to a month. Therefore, it may be useful to provide improved monitor systems for surge protection devices that alert operators relatively promptly if an SPD has reached end of life. Further, it may be useful to provide components that aggregate state updates of SPDs and transmit the aggregated data to an operator at a remote location who may then send maintenance to the location of the SPDs, if warranted (e.g., if an SPD should be replaced). Such an approach, for example, can effectively use relatively low-bandwidth communication systems to efficiently and promptly convey relevant monitoring information to remotely located operators.

Embodiments of the invention can address these and other issues. For example, in some embodiments of the invention, a monitor system for one or more surge protection devices can include an electronic hub and a sensor, each with corresponding communication systems (e.g., including known arrangements of general or special purpose processor devices and cellular or other data transmission systems to allow electronic communication with other devices). The sensor may be engaged to a surge protection device (or multiple devices) to wirelessly transmit an indication of an end-of-life or other state of the SPD to the hub. In some case, the sensor can also provide a local (e.g., visual) indicator at the SPD, so that a locally present operator can locally (e.g., visually) identify a particular SPD as being in a particular (e.g., end of life) state.

As another example, in some embodiments of the invention, one or more surge protection devices may be hardwired to an electronic communication hub to communicate an end-of-life (or other) state to the hub. In this respect, the hub may be used to aggregate information regarding which, if any, of the one or more surge protection devices have reached an end-of-life state, and then transmit information (e.g., alerts) regarding the end-of-life state update to an operator.

Therefore, embodiments of the invention may be generally useful for monitoring the state of surge protection devices. For example, some embodiments can promptly notify operators when one or more of the surge protection devices reach an end of life or other state relevant to maintenance operations.

More specifically, in some embodiments, a hub may be configured for wireless (or other) communication with one or more remote devices (e.g., a server, computer, mobile phone, wearable computing device, etc.). A sensor may include a detector that is configured to detect the end of life (or other) state of an SPD, and a transmitter that is configured to transmit a corresponding signal to the hub to indicate the end of life state. The hub can thus receive an end-of-life signal from the sensor (e.g., wirelessly over short ranges) corresponding to an end of life state of the SPD, and then transmit corresponding information for further processing or display at a remote user device or control system (e.g., wirelessly over long ranges, or via wired connection to a relevant network).

In some cases, the SPD may include a flag that can automatically move to indicate an end of life (or other) state of the SPD, and a sensor may include a switch that is configured to be changed in state by the movement of the flag to indicate that the SPD has reached the end of life (or other) state. In some cases, a sensor can be configured to allow the flag to be visible as or after the flag moves. For example, a sensor, may include a transparent or translucent portion that visually reveals the flag, or may be formed so that the flag can extend outside of a housing of the sensor when the flag is triggered to indicate an end-of-life state.

In some cases, the sensor can include a light source that can be automatically illuminated based on the sensor detecting the end of life (or other) state of the SPD. Correspondingly, in some cases, an operator can be notified by a hub that an SPD for a particular installation (e.g., a railway bungalow) has reached an end of life (or other) state, can then go to the relevant location and relatively easily locate the relevant SPD (e.g., among a relatively large quantity of SPDs) based on a local (e.g., visual) indication from the SPD, the sensor, or both.

FIG. 1 illustrates a schematic view of a monitor system 100 for one or more surge protection devices 102. The monitor system 100 may include one or more sensors 104 that are configured to detect an end-of-life state of a surge protection device (SPD) 102. As described herein, an end-of-life state of an SPD may be a state that the SPD reaches at the end of its life (e.g., at which the SPD may no longer be viable for use in protecting against electrical surges). The monitor system 100 may further include a hub 106 that is configured for communication with one or more remote device 108. The sensors 104 may be coupled (e.g., removably, mechanically engaged) to one or more of the SPDs 102 to provide a wireless connection 110 to the hub 106. Alternatively, in some embodiments, a connection between the SPDs 102 and the hub 106 may include a hardwired communication 112 to one or more ports (e.g., dry contacts) on the hub 106 (e.g., NC/NO/COM contacts, or RS485 interfaces), as will be discussed further herein. In some cases, the hub 106 may be configured for wireless communication 110 with the one or more remote devices 108, although other communication channels can additionally (or alternatively) be provided (e.g., wired communication channels between the hub 106 and a remote server).

As further detailed below, the interface between the hub 106 and the one or more remote devices 108 (and the system 100, generally), may be useful for quickly alerting operators that SPDs (e.g., the SPDs 102) may have reached an end of life state. For example, based on alerts from the hub 106 that are prompted by signals from the sensors 104, operators may promptly dispatch maintenance technicians to the location of the one or more SPDs to perform necessary servicing (e.g., to replace the one or more SPDs that are at end of life).

The one or more remote devices 108 may be any one of a variety of remote devices that are not local (or at least not permanently local) to the hub 106. For example, the one or more remote devices 108 may include a server, a computer, a wearable computing device, a mobile phone, etc., as may generally form part of a distributed control system for a system that includes the SPDs 102. The wireless communication 110 may occur over, for example, a Wi-Fi network (which can include one or more wireless routers, one or more switches, etc.), a peer-to-peer network (e.g., a Bluetooth network), a cellular network (e.g., a 3G network, a 4G network, a 5G network, etc., complying with any suitable standard, such as CDMA, GSM, LTE, LTE Advanced, NR, etc.). (Bluetooth is a registered trademark of Bluetooth SIG, Inc. in the United States or other jurisdictions.) In some embodiments, the wireless communication 110 can occur over a local area network (LAN), a wide area network (WAN), a public network (e.g., the Internet), a private or semi-private network (e.g., a corporate or university intranet), or any other suitable type of network, or any suitable combination of networks. The wireless communication 110 can occur by Wi-Fi links, Bluetooth links, cellular links, etc. For example, the hub 106 may be configured to connect to a mobile phone via a Bluetooth signal. Alternatively, in some embodiments, the hub 106 may be hardwired (e.g., via wires, or fiber optic cables) for communication with one or more remote devices 108. For example, the remote device 108 may be a remove server, and the hub 106 may be wired for transmission to the remote server.

Surge protection devices (SPDs) may be utilized in relatively large quantities in environments with a plurality of electrical connections. For example, railway bungalows require a relatively large quantity of SPDs for electrical connections that monitor rails and signal crossings. Likewise, a variety of environments other than railway bungalows may also require one or more surge protection devices that would benefit from systems and methods disclosed herein. The illustrated example of FIG. 1 shows four SPDs 102. However, in alternative embodiments there may be any number of SPDs 102 (e.g., one, three, ten, or one hundred SPDs 102). Further, although the illustrated example shows two sensors 104, in alternative embodiments, there may be any number of sensors 104, including no sensors 104 in some cases.

Figure 2B:
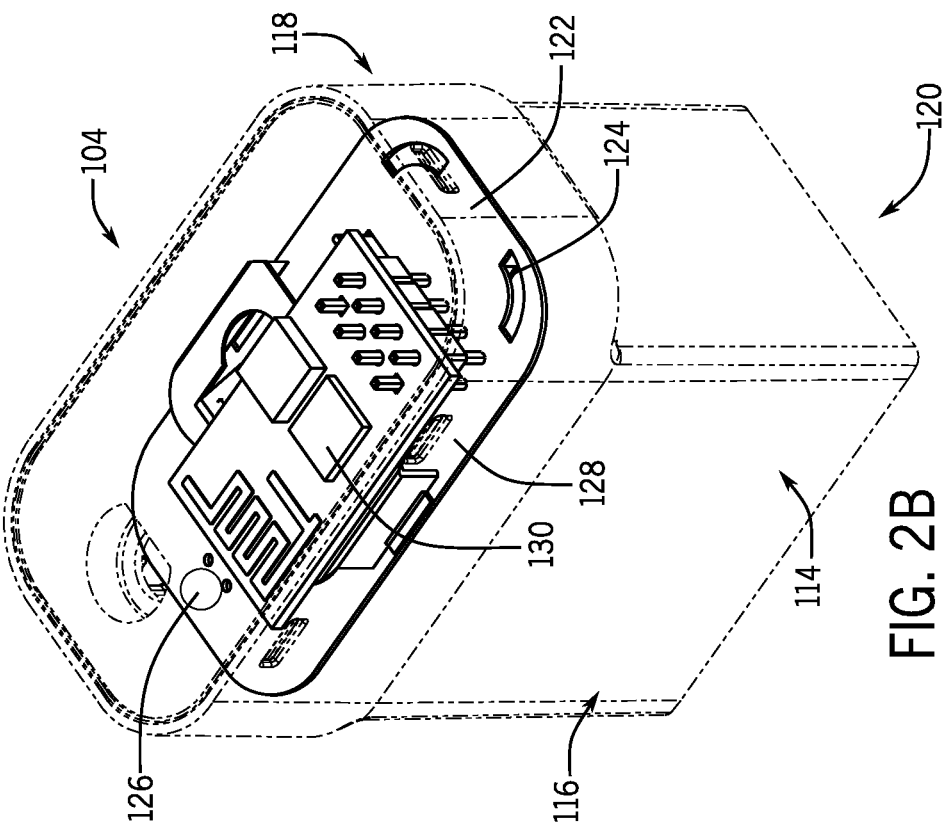
FIG. 2B is a top, front, and right isometric view of the sensor of FIG. 2A, according to an embodiment of the invention.
Figure 2A:
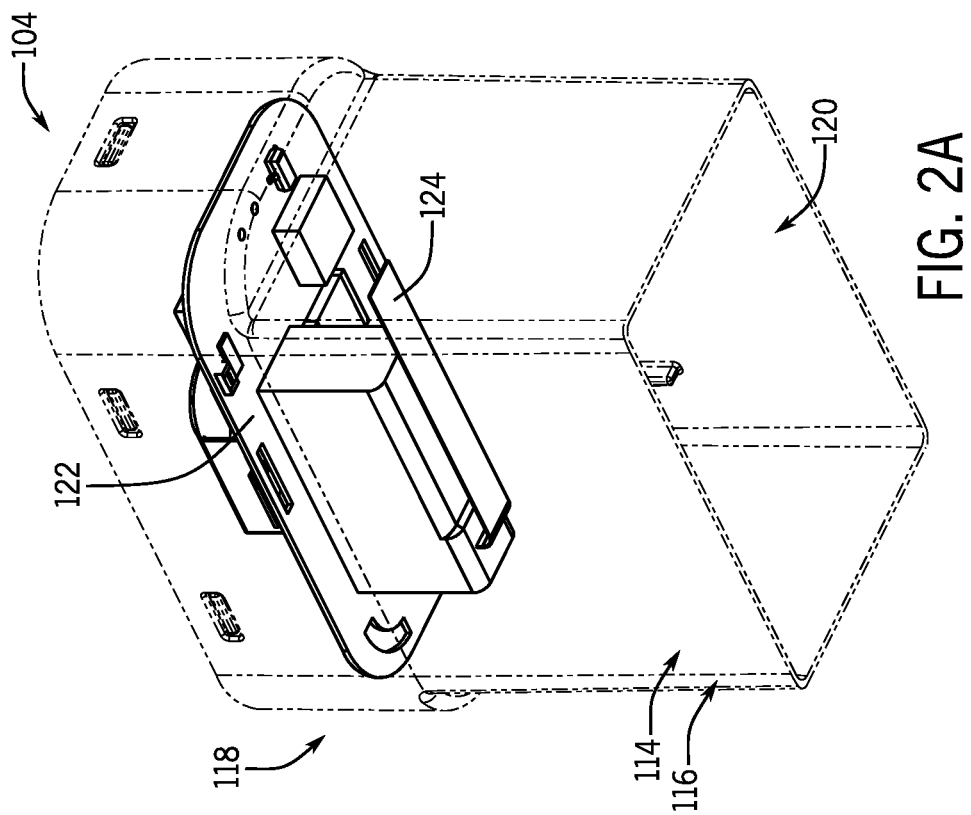
FIG. 2A is a bottom, rear, and left isometric view of a sensor for use with the monitor system of FIG. 1, according to an embodiment of the invention.

FIGS. 2A and 2B further illustrate the sensor 104, according to an embodiment of the invention. The sensor 104 may include a sensor housing 114 with a first portion 116 (e.g., lower portion) and a second portion 118 (e.g., upper portion). The sensor housing 114 may include one or more portions that are transparent or translucent, in some cases, so that internal components may be at least partially visible from outside the sensor housing 114 (e.g., as shown in FIG. 3B in particular). In this way, for example, or through other structural arrangements (e.g., cut-outs or other windows), the housing 114 of the sensor 104 can permit the flag to remain visible from outside of the housing 114 even after the sensor 104 is installed. The first portion 116 may have four walls that connect to form a cavity 120 that is generally rectangular prismatic in shape, although other cavity shapes may be possible depending on the shape of a relevant SPD, or other factors. The cavity 120 of the sensor housing 114 is dimensioned to receive a surge protector device (e.g., one of the one or more SPDs 102), as further discussed below.

To facilitate detection of end of life states of an SPD and corresponding communication to remoted devices, a sensor circuit board 122 may be included. In the illustrated example, the sensor circuit board 122 is disposed within the second portion 118 of the sensor housing 114, as may usefully arrange visual indicators of the sensor 104 for easy viewing. However, other configurations are possible.

Generally, a sensor can include a detector that can be configured to detect an end of life (or other) state of an SPD, as can include a mechanical detector (e.g., a switch), an electromagnetic detector (e.g., a Hall effect sensor, or other magnetic or electrical detector), or other known detectors for identifying a change in state of an SPD. In this regard, for example, the sensor 104 may further include a switch 124 that is in electronic communication with the sensor circuit board 122 and that may generally be configured to change in state in response to a change in state of an SPD. In the example illustrated in FIGS. 2 through 3B, the switch 124 is a mechanically activated micro-switch (i.e., a micro-switch that changes from a first state to a second state via mechanical contact). However, in alternative embodiments, the switch 124 may be a magnetic switch, an infrared- or other light-based switch (e.g., a light gate), or other known proximity-based switches, etc.

In different embodiments, different positions are possible for a switch, including different positions within a cavity. In this regard, some embodiments can include switches aligned to detect a position of a flag that corresponds to the flag being at a final position of a triggered state. For example a contact (or other) switch can be aligned when an SPD is received in a housing, so that the switch is contacted (or otherwise tripped) only when a flag of the SPD is in a fully-extended (or otherwise oriented) triggered state. Alternatively (or additionally), some embodiments can include switches aligned to detect an intermediate position of a flag as the flag moves toward a final position of a triggered state. For example, a contact switch or light gate can sometimes be arranged at an intermediate position, along a path of travel of a flag that extends between a ready state that indicates an operational SPD and a triggered state that indicates a current fault or other end-of-life event of an SPD. Thus, for example, a flag can sometimes trigger a switch as the flag moves toward a final position of a triggered state, before the flag has actually reached the final position.

Although the switch 124 may be beneficially disposed within the cavity 120, some configurations can include a switch outside of a cavity of a sensor housing, to allow the switch to interact with a relevant SPD. For example, in arrangements that do not include the housing 114 or that do not include the corresponding cavity 120 to receive an SPD, the switch 124 may be secured to other support structures to be aligned for activation by a flag of a relevant SPD (e.g., the SPD 102).

As generally noted above, to trigger communication of a detected state by a sensor, the switch 124 may be coupled to the sensor circuit board 122. Specifically, the switch 124 may extend from the sensor circuit board 122 into the cavity 120 to receive an indication of an end of life state from a surge protector and thereby trigger appropriate activity on the circuit board 122. In other embodiments, the switch 124 (e.g., as a mechanical contact switch or otherwise) may be otherwise configured to communicate detected information to the sensor circuit board 122 according to generally known principles for sensor arrangements.

The sensor 104 may further include various electrical components to facilitate various functions of the sensor 104. For example, the sensor circuit board 122 may include one or more light sources 126, a power source 128, and an electronic transmitter 130. The transmitter 130 may be an electronic communication device of any variety of known types, and can be configured to transmit a signal to a remotely located hub (e.g., the hub 106 (see FIG. 1)) or other remove device (e.g., remotely located server) to indicate a state of an SPD, as can facilitate management of maintenance activities, provide alerts to operators, or otherwise streamline operation of extended circuit networks with multiple SPDs. For example, the transmitter 130 can transmit a wireless signal that indicates an end-of-life state of the SPD 102, so that any need to replace or otherwise service the SPD 102 can be received and appropriately processed (e.g., assigned for service) by a remote control system (e.g., a remote server, as contacted via the hub 106). In this regard, any variety of known transmission protocols can be used, with notable advantages being provided by wireless transmission in some examples (e.g., using Wi-Fi or cellular networks, or other lower-range communication channels) but with wired communication also being possible in some cases.

The light source 126 may be a light emitting diode (LED), or may be any suitable source of light that may be coupled to the sensor circuit board 122. Generally, the light source 126 may emit light to indicate that an SPD (e.g., one of the one or more SPDs 102) has reached an end of life (or other) state. In some cases, the light source 126 may be configured to illuminate in flashes to conserve power from the power source 128. In a preferred embodiment, the light source 126 is a red LED because a red LED may be quickly noticed by a person who is searching for an SPD with an activated light source amongst a plurality of SPDs.

During an example in-field operation, an SPD may fail, thus triggering activation of the sensor via the switch 124. Upon the switch 124 detecting that the SPD is in an end-of-life state, the circuit board 122 may activate the light source 126 to intermittently emit a red light. Further, the sensor 104 may send a signal to the hub 106, via the transmitter 130, to indicate that an SPD has failed. As appropriate, the hub 106 may then send a signal to the remote device 108 to indicate that the SPD has failed, and an operator can accordingly be dispatched to locate an SPD in a particular location that is showing a flashing red light. Upon locating the SPD with the flashing red light, the operator may turn the sensor 104 to an off state and replace the SPD.

In different implementations, the hub 106 can alert a remote system to an end-of-life state of an SPD with different timing. In some cases, the hub 106 may not signal the remote device 108 immediately upon receipt of an end-of-life signal from a sensor, but may instead signal the remote device 108 on a predetermined (e.g., regular) interval or upon detecting that the remote device 108 has moved to within wireless transmission range. Similarly, in some cases, the hub 106 may sometimes transmit an indication of a particular state of one or more SPDs only after the remote device 108 has been paired and connected with the hub 106.

In some cases, a sensor can be configured to be attachable to an existing (e.g., already-installed) SPD. In some cases, a sensor can be configured to be removably attachable to an existing SPD, and can thus be later reused with a different SPD. As one example, FIG. 3 illustrates an exploded view of the sensor 104 coupled to the SPD 102, according to an embodiment of the invention. In some embodiments, the cavity 120 of the sensor 104 may be dimensioned to receive the SPD 102, and specifically the SPD housing 132, via a press fit. In other cases, however, other configurations are possible (e.g., snap-fit engagements).

In the illustrated example, the sensor 104 can be moved toward or away from the SPD 102 (as indicated by the arrow in FIG. 3A) to install the sensor 104 on or remove the sensor 104 from the SPD 102. Thus, the sensor 104 can be easily moved into an installed configuration as needed, including as shown in FIG. 3B. In particular, each of the four walls of the lower portion 116 of the sensor housing 114 that form the cavity 120 may be moved overlay the two pairs of laterally opposed walls of the SPD housing 132, although other embodiments can exhibit other installed configurations, including other relative insertion depths, geometrical profiles, engagement types, etc.

Because easily installed (e.g., as shown in FIGS. 3A and 3B), the sensor 104 may be used as part of a retrofit system to an existing SPD installation. Correspondingly, the sensor 104 may be configured to engage an SPD after the SPD is installed for operation, including as may not require removal of the SPD from, or the de-energizing of, any relevant circuit(s). In some embodiments, a sensor may be integrated with a module that also includes an SPD.

As shown in the illustrated embodiment, the SPD 102 may have a movable component 134 that, when triggered (i.e., when moved to a triggered state), may extend through a wall of the SPD housing 132. In particular, in the illustrated example, the SPD housing 132 has two pairs of laterally opposed walls, and the movable component 134 is formed as a flag that can extend through a top wall 136 of the SPD housing 132 that is directly connected to each of the two pairs of laterally opposed walls. In other examples, however, a flag can extend or otherwise move to a triggered state in other ways, with corresponding changes to the placement or type of a detector t detect the movement, as appropriate. Likewise, transition to an end-of-life state for the SPD 102 can correspond to movement of other components of the SPD 132, and some examples can include detectors arranged to detect those movements, including through direct contact as further discussed below or through other known detection techniques.

As used herein, the term flag refers to any structural component that moves in space from a first state (e.g., a down position) to a second state (e.g., an up position), based on the SPD 102 entering an end of life state, or some other type of state, to indicate the change in the state of the SPD 102 to an operator. Generally, in response to the SPD 102 entering an end-of-life state, a flag may move to a triggered state in which the flag extends outside of an SPD housing or is otherwise visible to an operator to indicate that the SPD is at end-of-life. In the example shown, the flag 134 is generally planar tab, with a top profile that has a similar (e.g., congruent) curvature as a corresponding wall of the SPD 102 and is thus configured to be entirely recessed within the body of the SPD 102 when in a ready state corresponding to normal operation of the SPD 102. In other examples, other forms are possible, including with flags formed as round, square, or other posts, as linearly or rotationally extendable bodies, or as components that deform (e.g., rather than move in bulk) to indicate a change in SPD state.

Further in this regard, the flag 134 may be configured to move in various ways to indicate an end-of-life state of the SPD 102. For example, as shown in FIG. 3A, the flag 134 may be entirely (or partly) contained within the SPD housing 132 until the SPD 102 enters an end-of-life state. When the SPD 102 enters an end-of-life state, the flag 134 may then be automatically extended out of (or further out of) the SPD housing 132 (e.g., as shown at 134a, in FIG. 3A) to indicate that the SPD 102 has entered an end-of-life state. Additionally, because the sensor housing 114 may be translucent or transparent, the sensor housing 114 may permit the flag 134 to remain visible, while the sensor 104 is engaged with the SPD 102, after the flag 134 moves to indicate an end-of-life state of the SPD 102. Therefore, in addition to (or as an alternative to) the one or more light sources 126 or other signals, the flag 134 may act as a visual cue to notify an operator that the SPD 102 needs to be replaced.

Generally, a sensor can be configured to interact with a flag of an SPD to detect an indication that the SPD has entered an end-of-life (or other) state. For example, the flag 134 may contact the switch 124 in the cavity 120 of the sensor 104 to change a state of the switch 124 (e.g., flip the switch 124 on or off). Correspondingly, the sensor 104 may be configured to be engaged with the SPD 102 so that the switch 124 is located to be moved by the movement of the flag 134 (e.g., so the flag 134 is arranged to extend into contact with the switch 124). When the flag 134 moves the switch 124 from a first state to a second state, the switch 124 may activate appropriate further activity by the sensor 104, including for wireless transmission of a signal to the hub 106, via the transmitter 130, indicating that the SPD 102 has entered an end-of-life state. The first state of a flag can in some cases be a ready state corresponding to normal operation of a surge protection device (e.g., prior to any surge having tripped the SPD or the SPD otherwise having entered an end of life state). The second state of a flag can in some cases be a triggered state corresponding to a surge protection device being in an end-of-life state.

Detecting a state of a flag in particular can be useful for retrofit systems, as sensors can thus be readily used with SPDs that may not have been originally designed for integration with electronic monitoring systems. However, some embodiments can also (or alternatively) detect movement of other components of an SPD (e.g., internal electrified or support components) to identify an end-of-life state of the SPD.

In some cases, when the switch 124 is triggered, the sensor 104 may also (or alternatively) activate visual indicators on the sensor 104 itself. For example, triggering the switch 124 can cause the sensor 104 to automatically illuminate the one or more light sources 126 on the sensor 104 (as also generally discussed above).

In some cases, activation of a switch can power on a relevant sensor. For example, by powering on only after the flag 134 activates the switch 124, the sensor 104 may be able to conserve battery life. In some cases, the transmitter 130 may only be activated to send a single end-of-life signal to the hub 106 at the moment that the flag 134 switches the state of the switch 124 to indicate that the SPD 102 may have entered an end-of-life state. For example, the sensor 104 may use a signal of an average of 6 mA over 9 seconds (e.g., a standard handshake) to signal to the hub 106 that the SPD 102 has entered an end-of-life state, which may be understood to correspond to a relatively low amount of battery power for a particular device (e.g., only 3 µA before entering a sleep mode). In other words, a sensor may sometimes indicate an end-of-life state simply by communicating at all with a hub, and may not otherwise transmit any information to the hub during normal operation.

Figure 4:
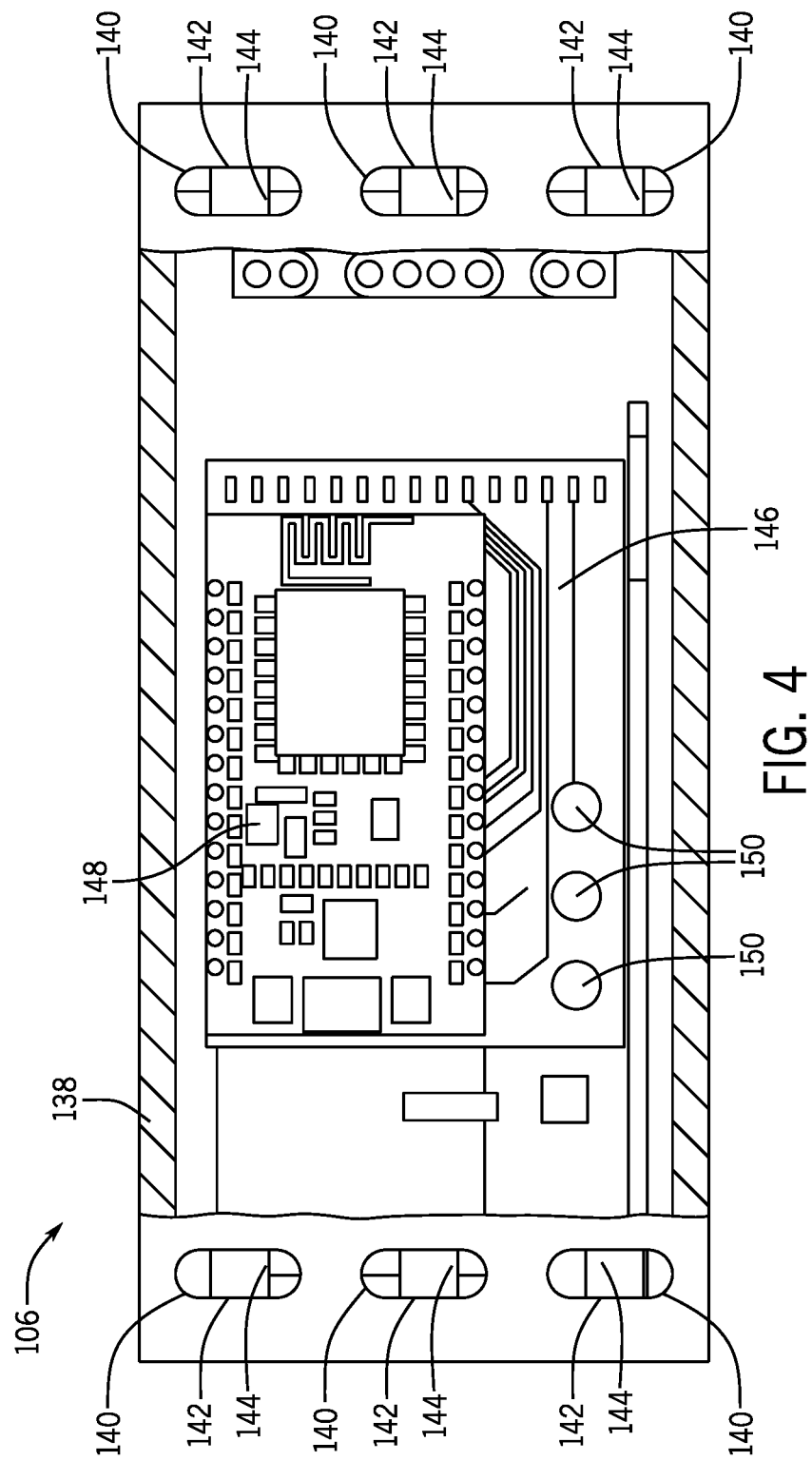
FIG. 4 is a top plan view of a hub, according to an embodiment of the invention, with a cover removed to illustrate internal components.

As also discussed above, a hub may generally include a variety of input and output ports and related components, as can facilitate communication with a desired number and types of sensors, SPDs, and remote devices. Referring now to FIG. 4, an example configuration the hub 106 is illustrated in further detail. The hub 106 may include a hub housing 138 that includes one or more cutouts 140 that extend therethrough the hub housing 138 to expose monitoring ports 142 (e.g., with dry contacts 144). The hub 106 may further include, within the hub housing 138, a hub circuit board 146. The hub circuit board 146 may include a wireless transceiver 148, or one or more hub light sources 150.

Referring specifically to the illustrate example, there are six monitoring ports 142 shown. However, in alternative embodiments, there may be a different number of monitoring ports, including zero ports similar to the ports 142 in some cases. Generally, the sensors 104 may be wirelessly connected to the hub 106 (e.g., via WPA2 transmission protocol) and the hub 106 can include known wireless communication devices for that purpose. However, in some cases, one or more of the SPDs 102 may be hardwired to the monitoring ports 142 in the hub 106.

In some cases, the monitoring system 100 may provide appropriate security features. In some cases, a user may need to complete a pairing process to wirelessly connect the one or more sensors 104 to the hub 106. For example, a pairing process may comprise a media access control (MAC) address of the sensor transmitter 130 (see FIG. 3) being recorded into an erasable programmable read-only memory (EEPROM) of the hub 106. The hub 106 may then check, when it receives a signal from the sensor transmitter 130, if the pairing is authenticated (e.g., if the MAC address of the sensor transmitter is correctly saved into the EEPROM on the hub), before the hub 106 processes the signal from the sensor 104. The sensor 104 and the hub 106 may then communicate using WPA2 transmission protocol or other known protocols. In other examples, other known pairing processes can be used, including as can ensure that communication channels are established only with known or authorized devices, that communications are properly formatted or secured, etc.

As also noted above, the one or more dry contacts 144 (e.g., NC/NO/COM contacts) can sometimes receive a wired connection from one or more of the SPDs 102 to determine if any one of the SPDs 102 are in an end-of-life state. The one or more dry contacts 144 can also, or otherwise, receive a wired connection from one or more other electronic devices (not shown) to determine if a state (e.g., on or off) of the one or more other electronic devices has changed. The hub 106 may detect if a state of the one or more dry contacts 144 changes. For example, the state of at least one of the one or more dry contacts 144 may change from on to off, or alternatively, from off to on. The hub 106 may detect if the state of the one or more dry contacts 144 changes and may then send a signal, via the wireless transceiver 148, to the remote device 108 (see FIG. 1) to indicate that a state change has occurred.

The one or more light sources 150 on the hub circuit board 146 may be configured to illuminate based on the hub 106 receiving one or more signals from the one or more sensors 104 that indicate an end-of-life state of any one or more of the SPDs 102. The one or more light sources 150 may be light emitting diodes (LEDs). The one or more light sources 150 may be generic with respect to each other (e.g., they may all be the same color, brightness, or flash with the same frequency). Alternatively, in some embodiments, the one or more light sources 150 may be unique to particular SPDs or states to be indicated (e.g., they may be different colors or brightness, or may flash with different patterns), to provide immediate visual notification to an operator of which of the one or more SPDs 102 require attention. Further, in some embodiments, the one or more light sources 150 may be unique to indicate differences between faults that may require immediate attention (e.g., an SPD that needs to be replaced), and faults that may not require immediate attention.

Generally, the hub 106 may be used to aggregate fault information from one or more SPDs. Correspondingly, the hub 106 may be configured to transmit a single aggregated end-of-life indicator based on receiving any one or more sensor signals from the one or more sensors 104 that indicate an end-of-life state of any one or more of the SPDs 102.

Further, the hub 106 may be configured to transmit a single end-of-life indicator based on receiving, via a wired connection, any one or more signals from the one or more SPDs 102 that indicate a changed state of any one or more of the SPDs 102. Thus, for example, referring again to FIG. 1, the hub 106 can sometimes receive multiple end-of-life signals from the sensors 104 that indicate an end-of-life state form multiple of the SPDs 102. In some cases, the hub 106 can then wirelessly transmit to the remote device 108 a single end-of-life indicator that indicates an aggregated end-of-life state of the multiple SPDs 102 (i.e., an indicator that can indicate that one or more of the SPDs 102 has failed, without necessarily indicating which SPD(s) in particular). In other words, the hub 106 can sometimes transmit a general signal that indicates a need to check multiple SPDs for potential end-of-life states, without necessarily indicating which one or more of the SPDs actually failed. Such an aggregated communication approach can be useful, for example, for railway bungalows or other more remote locations, for which transmission of large amounts of data may be difficult.

In some implementations, devices or systems disclosed herein can be used, manufactured, or installed using methods embodying aspects of the invention. Correspondingly, any description herein of particular features, capabilities, or intended uses of a device or system is generally intended to include disclosure of a method of using such devices for the intended purposes, of a method of otherwise implementing such capabilities, of a method of manufacturing relevant components of such a device or system (or the device or system as a whole), and of a method of installing disclosed (or otherwise known) components to support such purposes or capabilities. Similarly, unless otherwise indicated, discussion herein of any method of manufacturing or use for a particular device or system, including installing the device or system, is intended to inherently include disclosure, as embodiments of the invention, of the utilized features and configurations, and implemented capabilities of such device or system.

Figure 5:
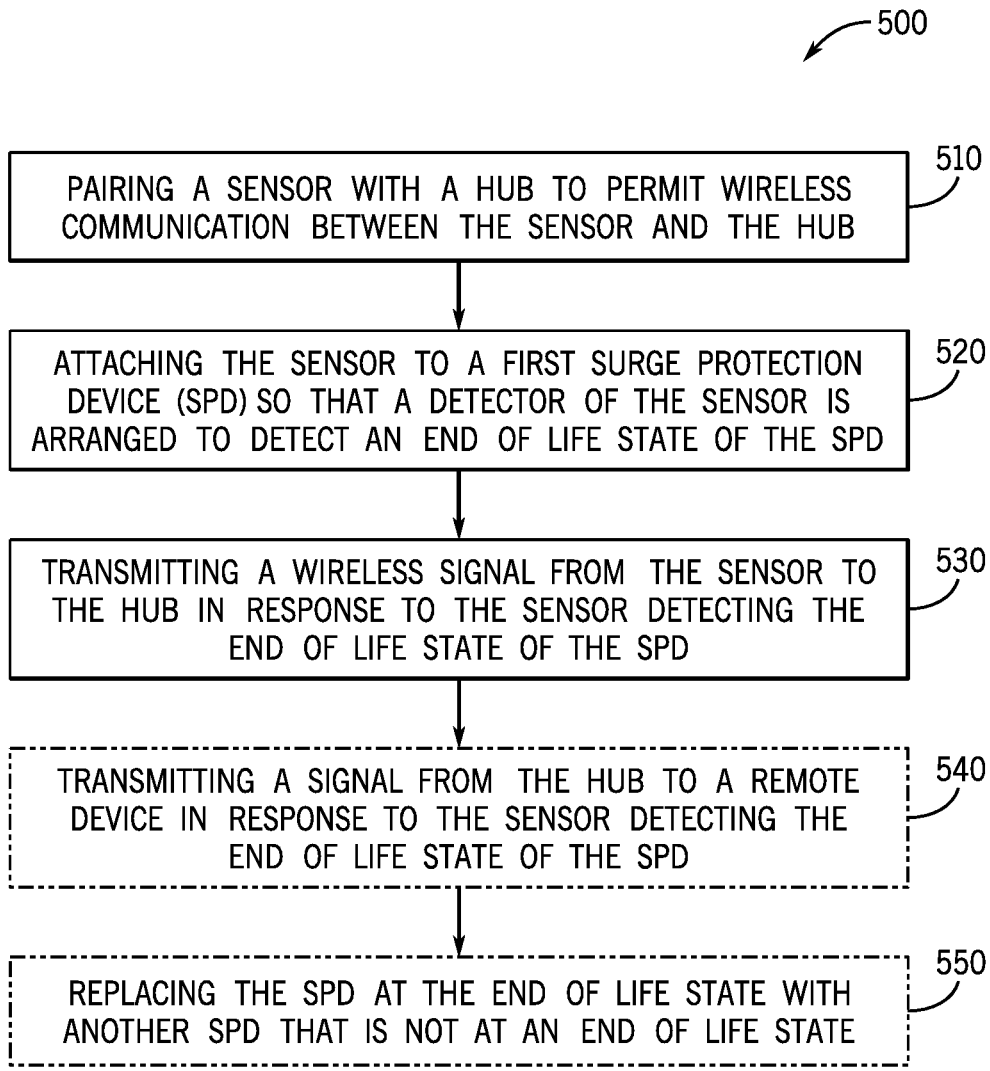
FIG. 5 is an example flowchart of a method of monitoring surge protection devices, according to an embodiment of the invention.

In this regard, for example, FIG. 5 illustrates an example method 500 of monitoring surge protection devices. In some cases, the method 500 can be implemented using the monitor system 100. In other cases, the method 500 can be implemented with other monitor systems for one or more surge protection devices.

The method 500 may include pairing 510 a sensor with a hub to permit wireless communication between the sensor and the hub. The process for the pairing 510 may correspond to the pairing process discussed earlier herein with respect to the hub 106 and the sensor 104. For example, the pairing process may comprise a media access control (MAC) address of a sensor transmitter being recorded into an erasable programmable read-only memory (EPROM) of the hub. The hub may then check, when it receives a signal from the sensor transmitter, if the pairing is authenticated (e.g., if the MAC address of the sensor transmitter is correctly saved into the EPROM on the hub), before the hub processes the signal from the sensor. In other cases, however, a sensor can be otherwise paired for communication with a hub.

Continuing, the method 500 may sometimes include attaching 520 the sensor to a first surge protection device (SPD) so that a detector of the sensor is arranged to detect an end of life state of the SPD. In some cases, the method 500 can include removably attaching 520 the sensor, including as part of a retrofit operation for the SPD. In some cases, the detector may include a mechanical switch (e.g., the switch 124 discussed earlier herein). Further, the sensor may be engaged to the SPD before the SPD is installed for operation (e.g., as an integral, rather than removable, part of an SPD package), or after the SPD is installed for operation.

Once an end of life state is detected, the method 500 may include transmitting 530 a wireless signal to the hub, from the sensor, based on the sensor detecting the end of life state of the SPD. In some cases, the method 500 may further include transmitting 540 a wireless signal to a remote device from the hub, based on the sensor detecting the end of life state of the SPD (e.g., as triggered by the transmitted 530 signal).

As appropriate, the method 500 may then further include replacing 550 the SPD at the end of life state with another SPD that is not at an end of life state. Correspondingly, in some cases, the sensor can sometimes be removed from the end of life SPD and then attached 520 to the replacement SPD for continued monitoring. In such a case, for example, the sensor may remain paired with the hub, or another pairing 510 can be implemented as needed.

Generally, embodiments of the invention, including the monitor system 100 for one or more surge protection devices, and the method 300, can be used to monitor one or more surge protection devices to alert an operator when at least one of the one or more surge protection devices may be at an end of life (or other) state. Additionally, embodiments of the invention can help to quickly locate a surge protection device that may be at an end of life state using visual indicators such as flags and lights. Therefore, embodiments of the present invention can help to accelerate service of surge protection devices, thereby providing more effective surge protection for a variety of electrical installations.

In some embodiments, aspects of the invention, including computerized implementations of methods according to the invention, can be implemented as a system, method, apparatus, or article of manufacture using standard programming or engineering techniques to produce software, firmware, hardware, or any combination thereof to control a processor device (e.g., a serial or parallel general purpose or specialized processor chip, a single- or multi-core chip, a microprocessor, a field programmable gate array, any variety of combinations of a control unit, arithmetic logic unit, and processor register, and so on), a computer (e.g., a processor device operatively coupled to a memory), or another electronically operated controller to implement aspects detailed herein. Accordingly, for example, embodiments of the invention can be implemented as a set of instructions, tangibly embodied on a non-transitory computer-readable media, such that a processor device can implement the instructions based upon reading the instructions from the computer-readable media. Some embodiments of the invention can include (or utilize) a control device such as an automation device, a special purpose or general purpose computer including various computer hardware, software, firmware, and so on, consistent with the discussion below. As specific examples, a control device can include a processor, a microcontroller, a field-programmable gate array, a programmable logic controller, logic gates etc., and other typical components that are known in the art for implementation of appropriate functionality (e.g., memory, communication systems, power sources, user interfaces and other inputs, etc.). In some embodiments, a control device can include a centralized hub controller that receives, processes and (re)transmits control signals and other data to and from other distributed control devices (e.g., an engine controller, an implement controller, a drive controller, etc.), including as part of a hub-and-spoke architecture or otherwise.

The term "article of manufacture" as used herein is intended to encompass a computer program accessible from any computer-readable device, carrier (e.g., non-transitory signals), or media (e.g., non-transitory media). For example, computer-readable media can include but are not limited to magnetic storage devices (e.g., hard disk, floppy disk, magnetic strips, and so on), optical disks (e.g., compact disk (CD), digital versatile disk (DVD), and so on), smart cards, and flash memory devices (e.g., card, stick, and so on). Additionally it should be appreciated that a carrier wave can be employed to carry computer-readable electronic data such as those used in transmitting and receiving electronic mail or in accessing a network such as the Internet or a local area network (LAN). Those skilled in the art will recognize that many modifications may be made to these configurations without departing from the scope or spirit of the claimed subject matter.

Certain operations of methods according to the invention, or of systems executing those methods, may be represented schematically in the FIGS. or otherwise discussed herein. Unless otherwise specified or limited, representation in the FIGS. of particular operations in particular spatial order may not necessarily require those operations to be executed in a particular sequence corresponding to the particular spatial order. Correspondingly, certain operations represented in the FIGS., or otherwise disclosed herein, can be executed in different orders than are expressly illustrated or described, as appropriate for particular embodiments of the invention. Further, in some embodiments, certain operations can be executed in parallel, including by dedicated parallel processing devices, or separate computing devices configured to interoperate as part of a large system.

As used herein in the context of computer implementation, unless otherwise specified or limited, the terms "component," "system," "module," "block," "device," and the like are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "only one of," or "exactly one of." For example, a list of "only one of A, B, or C" indicates options of: A, but not B and C; B, but not A and C; and C, but not A and B. In contrast, a list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more A, one or more B, and one or more C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: one or more A and one or more B; one or more B and one or more C; one or more A and one or more C; and one or more A, one or more B, and one or more C.

Also as used herein, unless otherwise limited or defined, "configured to" indicates that a component, system, or module is particularly adapted for the associated functionality. Thus, for example, a transmitter configured to send a particular signal in response to a particular event is specifically adapted to send the signal in response to the event, as opposed to merely being generally capable of doing so.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein.

Various features and advantages of the invention are set forth in the following claims.

What is claimed is:

1. A surge protection system, the surge protection system comprising:
    a surge protection device including a flag movable between a ready state corresponding to normal operation of the surge protection device and a triggered state corresponding to an end-of-life state of the surge protection device; and
    a surge protection monitor system that includes a sensor, the sensor including: a switch, and an electronic transmitter configured to wirelessly transmit signals based on a state of the switch;
    the sensor having an installed configuration in which the sensor is secured to the surge protection device with the switch aligned to detect a position of the flag that corresponds to the triggered state; and
    with the sensor in the installed configuration, the electronic transmitter being configured to wirelessly transmit an end-of-life signal to indicate that the surge protection device is in the end-of-life state, in response to detection of the position of the flag by the switch.

2. The monitor system of claim 1, wherein, with the sensor in the installed configuration, the switch is aligned to be contacted by the flag via movement of the flag to the triggered state, to thereby detect the position of the flag.

3. The monitor system of claim 2, wherein the switch is configured to power on the sensor for transmission of the end-of-life signal when the switch is moved by the flag.

4. The surge protection system of claim 1, wherein the sensor includes a housing that defines a cavity;
    wherein, in the installed configuration of the sensor, the surge protection device is received into the cavity to secure the sensor to the surge protection device; and
    wherein the housing of the sensor permits the flag to remain visible from outside the housing, with the surge protection device received into the cavity and the flag in the triggered state.

5. The surge protection system of claim 4, wherein, in the installed configuration of the sensor, the surge protection device is received into the cavity to removably secure the sensor to the surge protection device.

6. The surge protection system of claim 4, wherein the flag is entirely contained within a housing of the surge protection device until the flag moves to triggered state.

7. The surge protection system of claim 1, wherein the sensor further includes a light source configured to be activated based on the sensor detecting a state of the flag to visually indicate the end-of-life state.

8. The surge protection system of claim 1, wherein the surge protection device is a first surge protection device and the surge protection system includes a plurality of surge protection devices;
wherein the monitor system further includes:
an electronic hub configured for wireless communication with one or more remote devices; and
a plurality of sensors, each configured to be removably secured to a corresponding surge protection device of the plurality of surge protection devices to detect an end-of-life state of the corresponding surge protection device and wirelessly transmit a corresponding end-of-life signal to the electronic hub; and
wherein the electronic hub is configured to transmit a hub signal to one or more of a remote server or a mobile device, in response to receiving one or more end-of-life signals, the hub signal indicating a corresponding end-of-life state of one or more of the surge protection devices.

9. The surge protection system of claim 8, wherein the electronic hub is configured to:
receive, from the plurality of sensors, a plurality of the end-of-life signals that correspond to two or more of the plurality of surge protection devices being in an end-of-life state; and
in response to receiving the plurality of the end-of-life signals, transmit a single state indicator that indicates an aggregated end-of-life state of the two or more surge protection devices.

10. The surge protection system of claim 8, wherein the electronic hub is configured to:
receive, from the plurality of sensors, a plurality of the end-of-life signals that correspond to two or more of the surge protection devices being in an end-of-life state; and
in response to receiving the plurality of the end-of-life signals, illuminate one or more light sources on the electronic hub to indicate an aggregated end-of-life state of the two or more surge protection devices.

11. The surge protection system of claim 10, wherein the one or more light sources include at least one light source configured to illuminate with one or more of different colors, different brightnesses, or different frequencies to indicate different end-of-life states.

12. The surge protection system of claim 8, wherein the surge protection device is a first surge protection device, and wherein the electronic hub is further configured to receive a signal from a second surge protection device, via a wired connection, to indicate an end-of-life state of the second surge protection device.

13. A retrofit system to monitor a surge protection device, the retrofit system comprising:
a sensor configured to be removably secured to a surge protection device;
the sensor including:
a housing configured to removably engage the surge protection device to secure the sensor to the surge protection device;
a detector configured to detect a movement of a component of the surge protection device corresponding to an end of life state of the surge protection device; and
a transmitter configured to transmit a wireless signal to a remotely located hub, in response to the detected movement, to indicate the end of life state of the surge protection device.

14. The retrofit system of claim 13, wherein the housing defines a cavity that is configured to receive the surge protection device to secure the sensor to the surge protection device.

15. The retrofit system of claim 14, wherein the housing is configured to receive the surge protection device into the cavity with a press fit engagement.

16. The retrofit system of claim 14, wherein the detector is a switch that is disposed within the cavity of the sensor housing to be activated by contact with a flag of the surge protection device.

17. The retrofit system of claim 13, further comprising:
an electronic hub configured to receive end-of-life signals from a plurality of retrofit sensors, corresponding to respective end-of-life states of each of a plurality of surge protection devices;
wherein the electronic hub is configured, in response to receiving multiple end-of-life signals, to wirelessly transmit an aggregated end-of-life signal to a remote device, the aggregated end-of-life signal indicating an end-of-life of any combination of one or more of the plurality of surge protection devices.

18. A method of monitoring surge protection devices, comprising:
retrofitting a surge protection device by:
removably engaging a housing of a sensor with the surge protection device to secure the sensor to the surge protection device, so that a detector of the sensor is arranged to detect a movement of a component of the surge protection device corresponding to an end-of-life state of the surge protection device; and
pairing the sensor with a remotely located hub to permit wireless communication between a transmitter of the sensor and the remotely located hub;
wherein the transmitter is thereby configured to transmit a wireless signal to the remotely located hub to indicate the end-of-life state of the surge protection device in response to the detector detecting the movement of the component of the surge protection device.

19. The method of claim 18, wherein removably engaging the housing with the surge protection device includes inserting the surge protection device into a cavity of the housing to align the detector to detect a movement of a flag of the surge protection device that corresponds to the end of lift state of the surge protection device.

20. The method of claim 19, wherein the detector is a switch configured to be moved by the flag to detect the movement of the flag.

* * * * *